United States Patent [19]
Usami et al.

[11] Patent Number: 5,912,911
[45] Date of Patent: Jun. 15, 1999

[54] OPTICAL SHORT PULSE RESHAPING DEVICE

[75] Inventors: Masashi Usami, Yono; Munefumi Tsurusawa, Kodaira; Yuichi Matsushima, Tokorozawa, all of Japan

[73] Assignee: Kokusai Denshin Denwa Kabushiki Kaisha, Tokyo, Japan

[21] Appl. No.: 08/864,477

[22] Filed: May 28, 1997

[30] Foreign Application Priority Data

Jun. 5, 1996 [JP] Japan ................................. 8-163669

[51] Int. Cl.$^6$ ............................................ H01S 3/10
[52] U.S. Cl. ............................................ 372/25
[58] Field of Search ........................... 372/25, 26, 44, 372/45, 8, 30; 359/244, 248

[56] References Cited

U.S. PATENT DOCUMENTS

| | | | |
|---|---|---|---|
| 4,555,785 | 11/1985 | Scifres et al. | 372/8 |
| 5,119,227 | 6/1992 | Dawson et al. | 359/244 |
| 5,414,726 | 5/1995 | Raj et al. | 359/244 |
| 5,546,415 | 8/1996 | Delfyett et al. | 372/25 |
| 5,559,628 | 9/1996 | Devaux | 359/248 |
| 5,801,872 | 9/1998 | Tsuji | 359/248 |
| 5,805,327 | 9/1998 | Usami et al. | 359/244 |

*Primary Examiner*—James W. Davie
*Attorney, Agent, or Firm*—Lackenbach Siegel Marzullo Aronson & Greenspan P.C.

[57] ABSTRACT

An optical short pulse reshaping device capable of effectively eliminating noise from or reshaping of input optical short pulses of a pulse width of picosecond order shorter than a carrier life time. The device comprises: a semiconductor laser element, means for injecting an electric current to the semiconductor laser element for obtaining an oscillation state of the semiconductor laser element, means for injecting into the semiconductor laser element input optical short pulses of a wavelength shorter than that of the oscillation light of said semiconductor laser element, and means for taking out optical short pulses emitted from the semiconductor laser element in distinction from its oscillation output light.

10 Claims, 6 Drawing Sheets

FIG. 3(a)

OPTICAL SIGNAL PULSE

FIG. 3(b)

OPTICAL OUTPUT SIGNAL PULSE FROM CONVENTIONAL SATURABLE ABSORPTION ELEMENT

FIG. 3(c)

OPTICAL OUTPUT SIGNAL PULSE EXTRACTED FROM OPTICAL SHORT PULSE RESHAPING DEVISE OF PRESENT INVENTION

OPTICAL SHORT PULSE RESHAPING DEVICE

BACKGROUND OF THE INVENTION

The present invention relates to a device for reshaping of and reducing noise from optical short pulses used in optical transmission systems, optical switching systems, etc.

Saturable absorption elements of utilizing an optical absorption saturation effect of a semiconductor can be applied to reshaping and noise reduction of optical short pulses. The optical absorption saturation effect of semiconductor is known as a property that, in a case where an optical signal of energy near a band-gap energy thereof is injected the semiconductor, its absorption coefficient decreases non-linearly while a transmittance thereof inceases non-linearly as an intensity if injected light increases. This absorption saturation effect is caused by a band filling effect in that electron-hole pairs produced by absorption of light raises a state occupation probability in a band to shift an absorption end to a higher energy side. Accordingly, the saturable absorption element absorbs weak noise when the intensity of the input optical pulse is lower than a threshold value, but it passes therethrough optical pulses of an intensity above the threshold value. Because of such an operation, the saturable absorption element can be used to reshape optical short pulses or reduce therefrom noise.

Figure 6A:
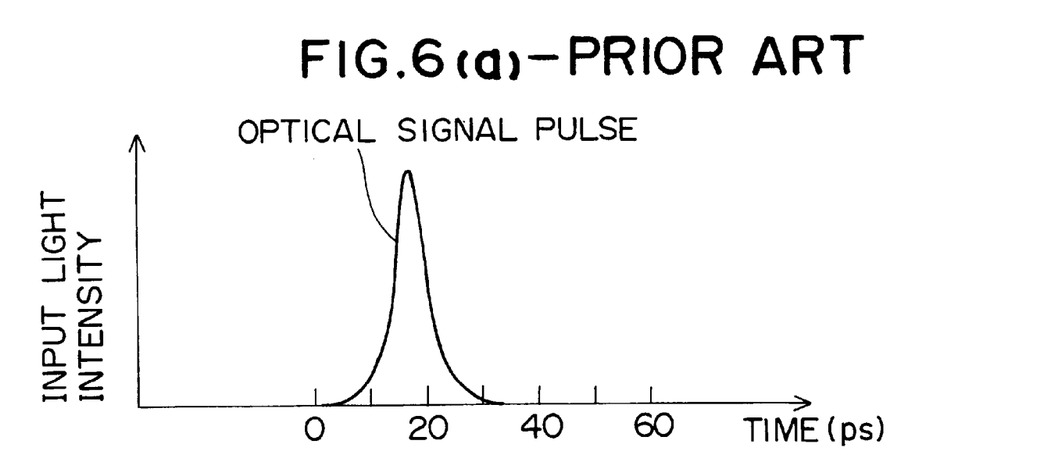
FIG. 6(a) shows a prior art a time chart of the light intensity of a signal pulse injected into the conventional saturable absorption element.
Figure 6B:
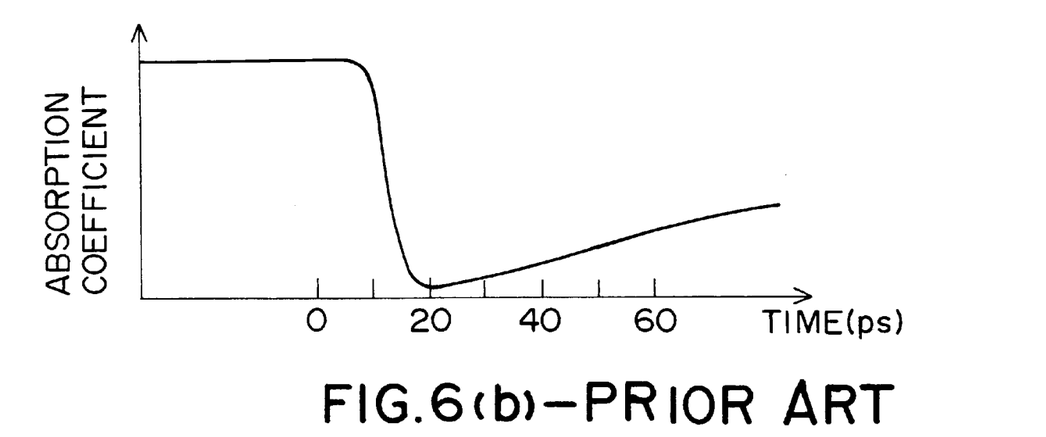
FIG. 6(b) shows a time chart of the absorption coefficient of the element.

In a time chart of a transmittance of an optical short pulse in a semiconductor saturable absorption element, a sufficiently fast response on the order of picosecond can be seen at a rise-up instant of the optical short pulse when an absorption coefficient decreases in response to absorption of an incident light. However, at a fall-down time instant of the optical short pulse when an intensity of the injected pulse decreases, a recovery time necessary to a normal absorption coefficient is a time of about a carrier (electron or hole) life time of the order of nanosecond. This is schematically shown in FIGS. 6(a) and 6(b). FIG. 6(a) shows a time chart of an intensity of an optical pulse and FIG. 6(b) a time chart of an absorption coefficient of a saturable absorption element disclosed in a prior application filed by the inventor of this application. For the reason given above, it is impossible with the saturable absorption element to completely eliminate noise from or reshape optical pulses of pulse widths shorter than the carrier life time. Conventional approaches for shortening the carrier life time in a saturable absorption element are, for example, a method for introducing impurities, defects or the like into the absorption layer, a method for extracting carriers from a saturable absorption element by applying a reverse bias to the p-n junction thereof and a method for extracting carriers produced in the absorption region through utilization of the tunnel effect. Yet no semiconductor saturable absorption element has been implemented which is capable of sufficiently responding to optical short pulses of picosecond order.

As mentioned above, conventional devices using such a saturable absorption element have such a drawback that a time necessary to recover a normal absorption coefficient is limited by a carrier life time. Hence, it is impossible with such a saturable absorption element to completely eliminate noise from or reshape optical short pulses of pulse widths shorter than the carrier life time.

SUMMARY OF THE INVENTION

An object of the present invention is to provide an optical short pulse reshaping device capable of effectively reducing noise from or reshaping input optical short pulses of a pulse width of picosecond order shorter than a carrier life time.

To attain the above object, the optical short pulse reshaping device of the present invention comprises: a semiconductor laser element, means for injecting an electric current to said semiconductor laser element for obtaining an oscillation state of said semiconductor laser element, means for injecting into said semiconductor laser element input optical short pulses of a wavelength shorter than that of the oscillation light of said semiconductor laser element; and means for taking out optical short pulses emitted from said semiconductor laser element.

The present invention is intended to shorten the absorption recovery time of the saturable absorption element of prior application limited by the carrier life time so as to effectively reduce noise from or reshape optical short pulses of pulse widths of picosecond order. The most important feature of the present invention is the use of an oscillating semiconductor laser as the saturable absorption element.

BRIEF DESCRIPTION OF THE DRAWINGS

The present invention will be described in detail below with reference to accompanying drawings, in which:

FIG. 1(a) schematically shows a time chart of a light intensity of an optical signal pulse injected into an optical short pulse reshaping device using a semiconductor laser element according to the present invention, and FIG. 1(b) schematically shows a time chart of an absorption coefficient of the semiconductor laser element for the optical signal pulse;

DETAILED DESCRIPTION

Figures 1A, 1B:
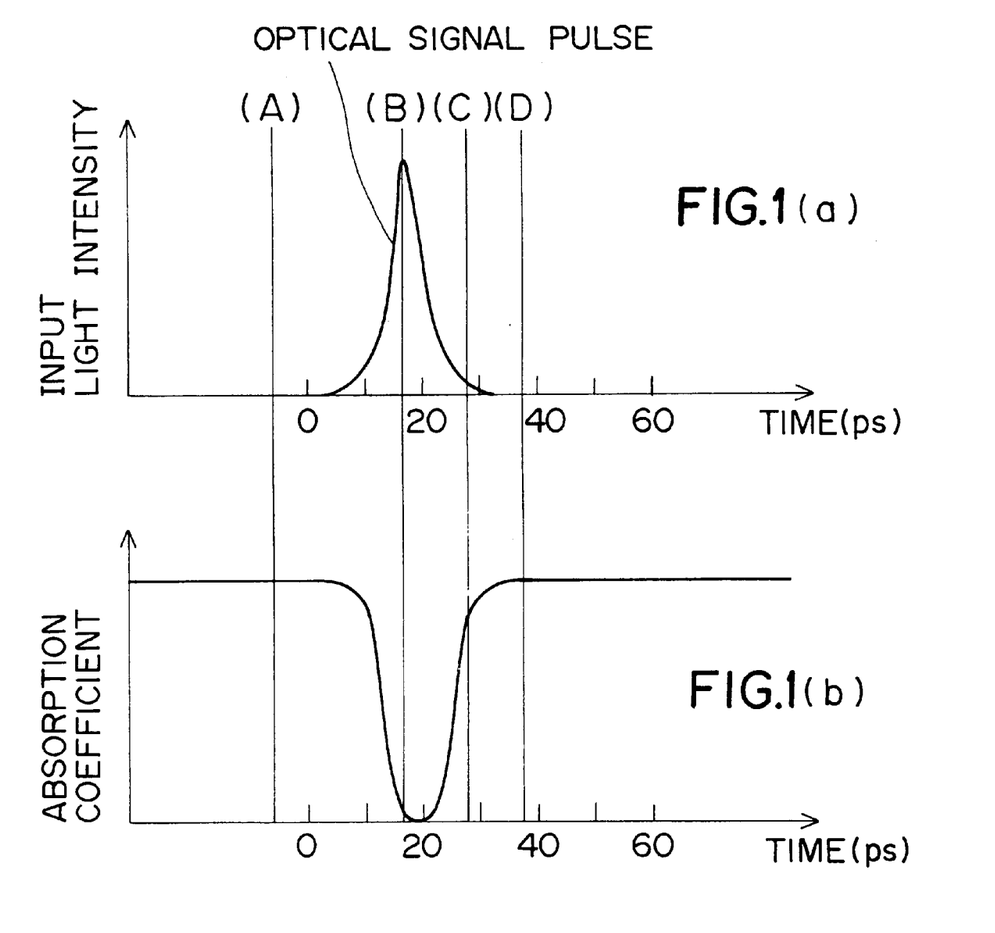

The principles of the present invention will be described at first. FIG. 1(a) is a graph schematically showing a time chart of an intensity of an optical signal pulse injected into a semiconductor laser element used in the present invention, and FIG. 1(b) is also a graph schematically showing a time chart of an absorption coefficient of the semiconductor laser element.

Figure 2A:
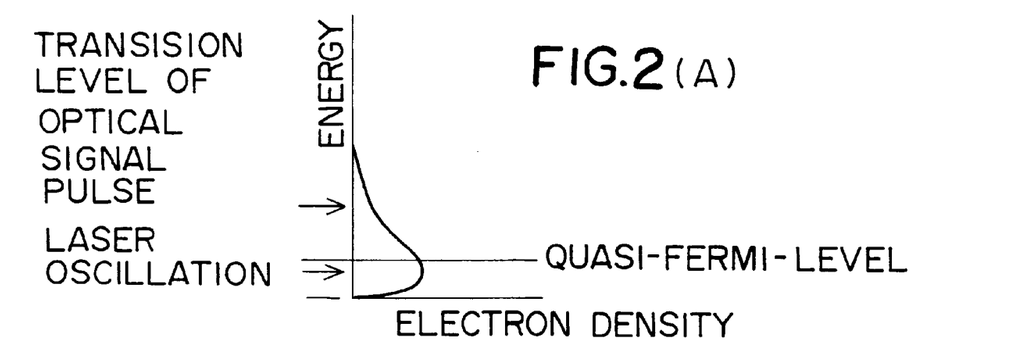
FIGS. 2(A)–2(D) schematically show, in time sequence, energy distribution of an electron in a conduction band in an active layer of the semiconductor laser element according to the present invention when an optical signal pulse has been injected thereinto.
Figure 2B:
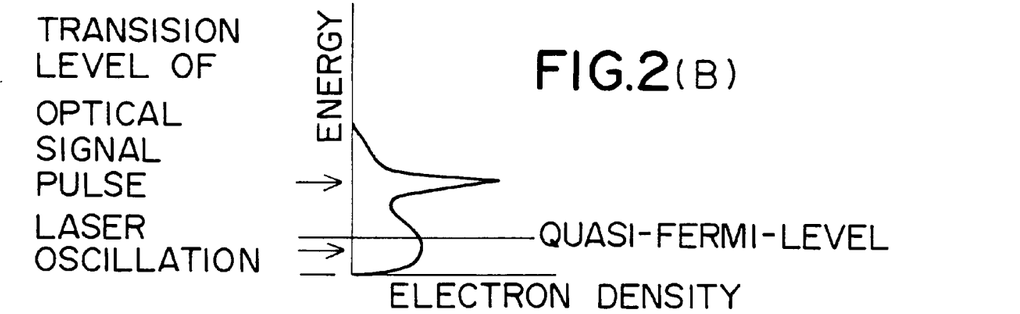
Figure 2C:
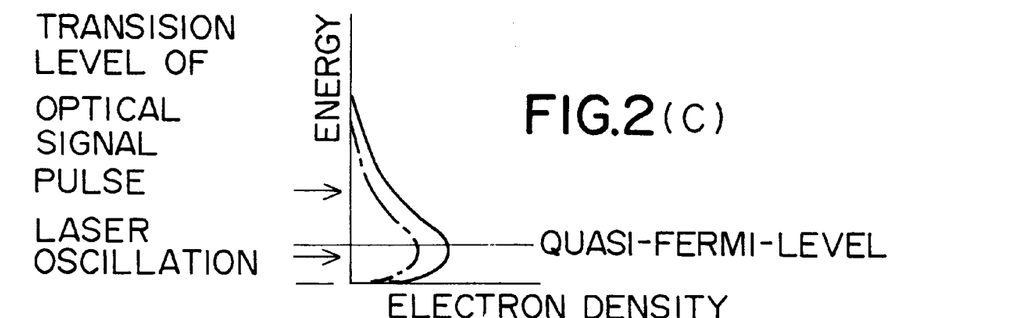
Figure 2D:
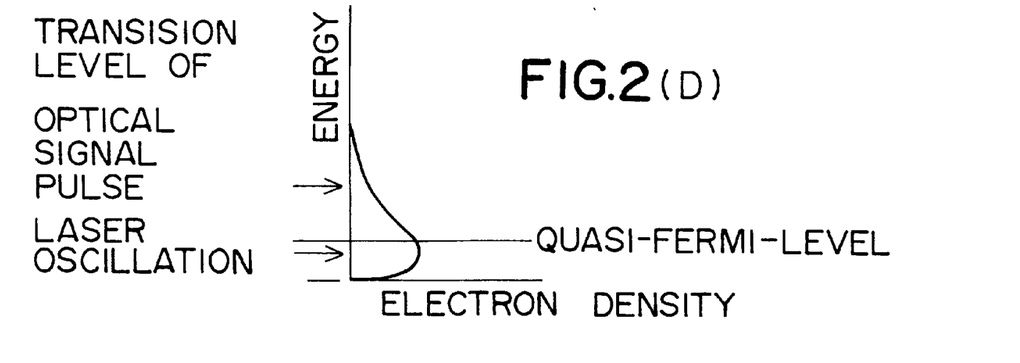

In FIGS. 2(A)–(D) there is schematically shown in time sequence energy distribution of an electron in a conduction band in an active layer of the oscillating semiconductor laser element into which an optical signal pulse has been injected in accordance with the present invention. In FIGS. 1(a)–1(b) and 2(A)–2(D), reference character (A) indicates a state (i.e. steady state) prior to the application of the optical signal pulse, (B) a state at the time of the optical signal pulse being injected, (C) a state immediately subsequent to the fall-down of the optical signal pulse, and (D) a state after completion of the application of the optical signal pulse. FIG. 2(A) is a diagram showing the electron distribution in the conduction band in the steady state prior to the application of the optical signal pulse; the semiconductor laser element oscillates at a wavelength corresponding to the peak of the electron distribution and has a sufficient absorption coefficient for input optical signal pulses of wavelengths shorter than the oscillation wavelength of the laser element {FIGS. 1(b)-(A)}. Next, when injected into the semiconductor laser element, the optical signal pulse is absorbed in the active layer, so that the electron density of an energy corresponding to the optical signal pulse abruptly increases and the absorption coefficient abruptly decreases {FIG. 1(b)-(B)}. This phenomenon is called as "spectral hole burning", which is relaxed to a distribution of thermal equilibrium state within a time of 100 femto second order as a result of an intra-band transition as shown in FIG. 2(C). The carrier density of this instant is maintained at the increased state in comparison with the carrier density before injecting the input optical signal pulse, while the absorption coefficient is also maintained at the decreased state. However, the thus increased carriers are instantaneously converted to light by a stimulated emission resulting from the oscillation of the laser element, again providing the steady state [FIG. 2(D, A)]. A carrier life time of 100 femto second order is necessary to relax the carrier density of the increased state to the stationary carrier density before injecting the input optical signal pulse. In this way, the semiconductor laser element acts as a saturable absorption element for optical signal pulses and achieves the recovery of the absorptance with a speed based on the stimulated emission and the intra-band relaxation.

As described above, the conventional saturable absorption element has a disadvantage that the carrier life time imposes a limitation on the time necessary for the recovery of the original absorptance after the element has reached its absorption saturated state, but according to the present invention, the absorptance recovery time can be made shorter than the carrier life time. Hence, the present invention permits effective reduction of noise from or reshaping of optical signal pulses of pulse widths of picoseconds order.

The above has clearly described the principles of the present invention and differences between the present invention and the prior art.

Figure 3A:
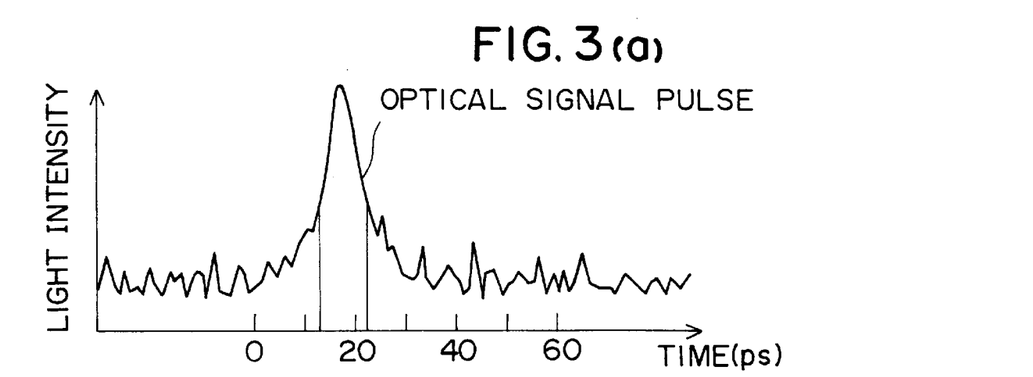
FIGS. 3(a)–3(c) schematically show output signal waveforms from a conventional saturable absorption element and the optical short pulse reshaping device of the present invention using the semiconductor laser element when signals with noise superimposed thereon have been applied to them.
Figure 3B:
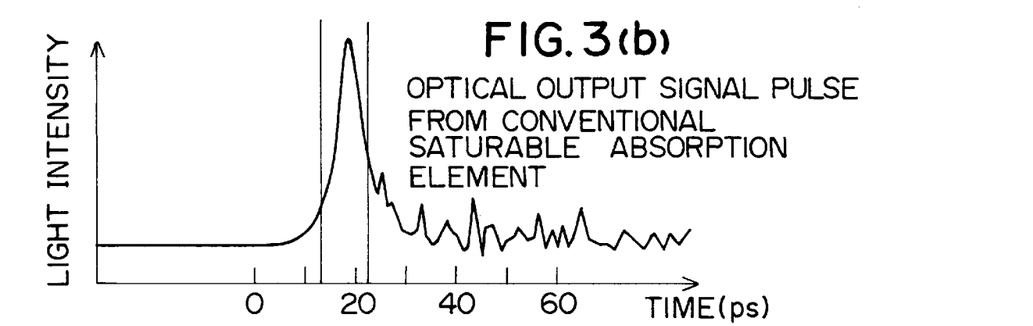
Figure 3C:
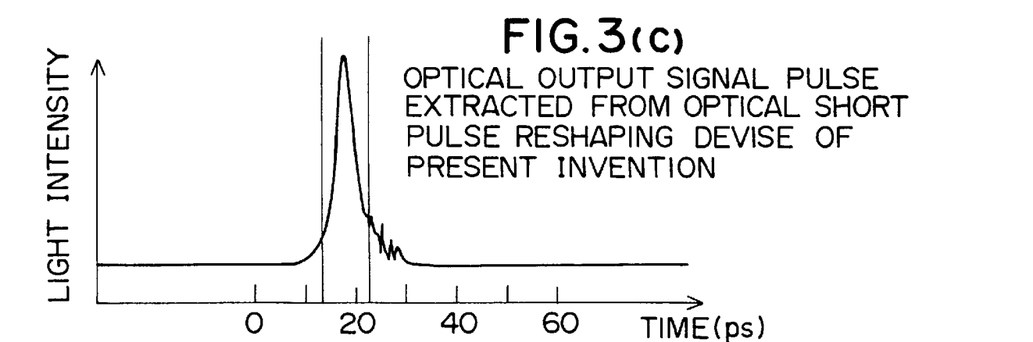

As referred to above, according to the present invention, it is possible to effectively reduce noise from or reshape optical short pulses whose pulse widths are on the order of picoseconds. This is schematically illustrated in FIG. 3. FIG. 3(a) shows an actual input signal waveform with noise superimposed on the optical signal pulse. FIG. 3(b) shows an optical output signal waveform from a conventional saturable absorption element; noise is eliminated prior to the injection of the optical signal pulse, but since the absorption coefficient does not recover its normal value immediately, no noise can be removed after the application of the optical signal pulse. FIG. 3(C) shows an optical signal pulse extracted from the output light of the oscillating semiconductor laser into which an optical signal pulse of a wavelength shorter than its oscillation light has been injected according to the present invention; in this case, noise at front and rear portions of the pulse are completely eliminated. Noise at the lower level portion of the optical signal pulse is also absorbed, so that the pulse can be reshaped substantially completely. In this instance, the semiconductor laser element serves as a saturable absorption element.

Embodiment 1

Figure 4:
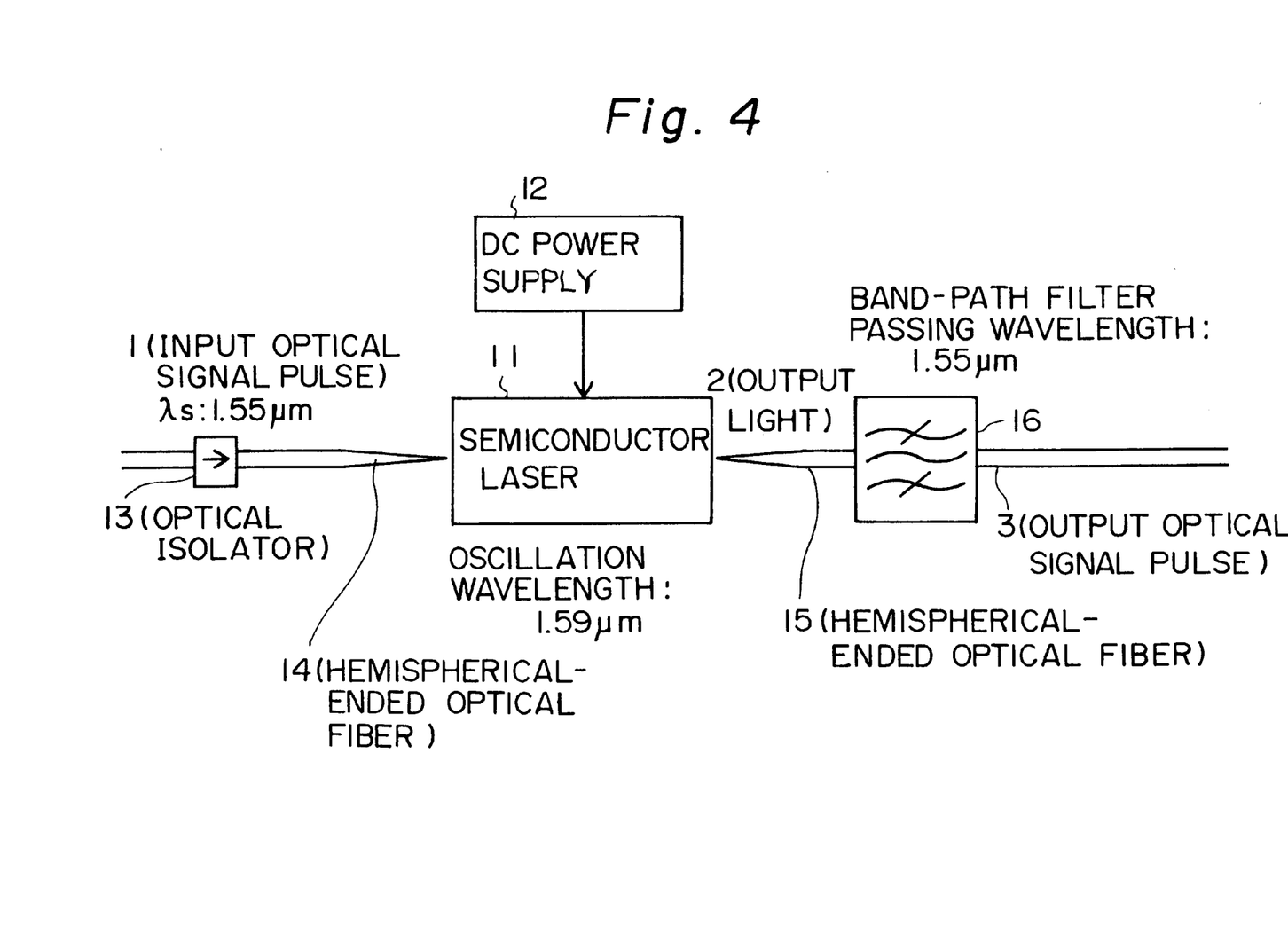
FIG. 4 illustrates in block form a first embodiment of the present invention.

An embodiment of the present invention will be described below in detail. FIG. 4 is a block diagram schematically illustrating the optical pulse reshaping device according to an embodiment of the present invention. A semiconductor laser element 11 is a waveguide type element which has its active layer formed by InGaAs/InGaAsP multiple quantum wells of 10 layers and has an element length of 200 $\mu$m. An 8-mA current, which is slightly larger than a threshold current (7 mA), is supplied from a DC power supply to the semiconductor laser element 11 to keep the oscillating state thereof. The laser oscillation output light has a wavelength of 1.59 $\mu$m and a spectral width of 20 nm at a 20 dB-down level from its peak level and is −5 dBm at each emitting end of the laser element. An input optical signal pulse 1 is injected into the semiconductor laser element 11 via an isolator 13 and a hemispherical-ended fiber 14 for coupling use. The optical signal pulse 1 is an optical soliton wave (0 dBm) which has a wavelength of 1.55 $\mu$m, a bit rate of 10-Gbps and a pulse width of 20-ps. In practice, the input optical signal pulse 1 has noise superimposed thereon and the noise level is of −15 dB in comparison with the peak level of the optical signal pulse. The output light 2 emitted from the semiconductor laser element 11 is an addition of the laser oscillation light and the optical signal pulse superimposed on each other, but the output light goes into a band-pass filter 16 which permits the passage therethrough of only the optical signal pulse to obtain an optical output signal pulse 3.

Turning back to FIG. 1(a), a description will be given of how the absorption coefficient (transmittance) of the semiconductor laser element for the input optical signal pulse varies with time. In the first place, in the steady state (A) prior to the injection thereto of the optical signal pulse, the semiconductor laser element 11 sufficiently absorbs low-level noise components superimposed on an optical signal pulse of a wavelength shorter than the laser oscillation light. This is the noise reducing function of the semiconductor laser element. Next, when the light intensity of the input optical signal pulse increases at its rise-up instant (B), the absorption coefficient of the semiconductor laser element 11 for the optical signal pulse 1 lowers, permitting the passage of the optical signal pulse through the semiconductor laser element 11. At this time, noise at the lower level portion of the optical signal pulse of low light intensity is sufficiently absorbed in the semiconductor laser element 11, so that the transmitting pulse rises up more sharply than does the input pulse. This is the reshaping function of the semiconductor laser element. Immediately after the fall-down of the optical pulse (C), the absorption coefficient of the semiconductor laser element 11 having reached the absorption saturated state remains low, allowing the passage of the trailing edge of the pulse through the laser element. Following this (D), the remaining unabsorbed carriers abruptly decrease due to a stimulated emission by the laser oscillation, recovering the normal absorption coefficient. As a result, the noise components superimposed on the optical signal pulse are absorbed again in the semiconductor laser element. The semiconductor laser element 11 yields, as the output optical pulse 2, the reshaped optical signal pulse and the oscillation output pulse, and the output optical pulse is fed to the band-pass filter 16 to select the optical signal pulse alone. An output optical signal pulse 3 ultimately obtained is an optical signal pulse with no oscillation output components. The noise level is of −22 dB in comparison with the peak level of the optical signal pulse, −7 dB in comparison with the noise level of the input optical signal pulse.

According to the present invention, the recovery time of an absorption coefficient of the saturable absorption element is on the order of picoseconds, and hence permits effective reduction of noise from or reshaping of optical signal pulses of pulse widths of picoseconds order.

Embodiment 2

Figure 5:
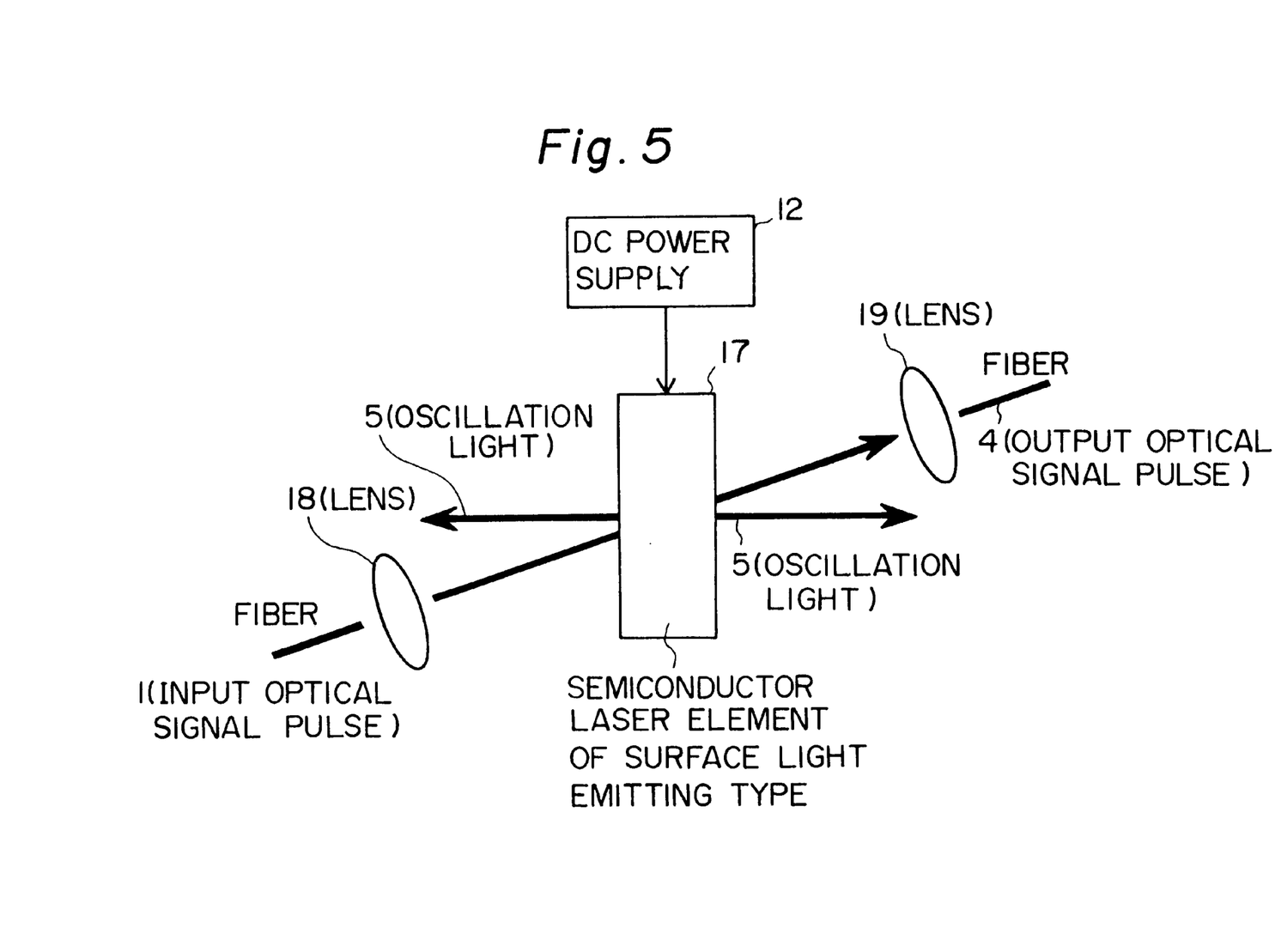
FIG. 5 illustrates in block form a second embodiment of the present invention.

FIG. 5 illustrates in block form the optical pulse reshaping device according to a second embodiment of the present invention. A semiconductor laser element 17 is a surface light emitting type and its active layer is formed by InGaAs/InGaAsP multiple quantum wells of 15 layers. A current of 21 mA, slightly larger than a threshold current of 20 mA, is supplied from a DC power supply 12 to the semiconductor laser element 17 to hold the oscillating state thereof. The laser oscillation output light has a wavelength of 1.59 μm and a spectral width of 20 nm at a 20 dB-down level from its peak level and an output of −5 dBm at the emitting end of the laser element. The input optical signal pulse 1 is the same as that used in the first embodiment. The optical signal pulse is focused by a lens 18 and is then slantwisely injected into the semiconductor laser element 11 so as to avoid interference with the optical path of the oscillation light (at right angles to the element). In this instance, since the output optical signal pulse 4 is also emitted in a direction which does not interference with the oscillation light, there is no need of selecting only the optical signal pulse by the band-pass filter as in Embodiment 1. A feature of the surface light emitting element is characterized by "polarization independency". The operation and effect of this embodiment are the same as those of the first embodiment.

While in the above the active layer of the semiconductor laser element has been described to employ an ordinary multiple quantum well configuration, the present invention is not limited specifically to such a semiconductor laser structure but is applicable to many sorts of semiconductor laser elements, such as those having their active layers formed by a strained multiple quantum well structure in which multiple quantum wells have tensile strains so as to provide the same gain for TE and TM polarized waves, a multiple quantum well structure in which quantum wells are alternately laminated with their different thickness values, and a low-dimensional quantum well structure using a quantum well wire or a quantum well boxe.

Although the present invention has been described to use the semiconductor laser element which oscillates at a single wavelength, it is also possible to use a semiconductor laser element which oscillates at a plurality of wavelengths. In such an instance, it is necessary to employ means for injecting into the semiconductor laser element optical signal pulses of a wavelength shorter than the shortest one of the oscillation light of the semiconductor laser element.

The above-described reshaping function could be further stabilized by using optical signal pulses of wavelengths 0.01 μm to 0.06 μm (or 0.08 μm) shorter than that of the oscillation light of the semiconductor laser element.

Moreover, the semiconductor laser element has been described to be formed of the InGaAsP semiconductor of the 1.5 μm wavelength range but other III–V and II–VI compound semiconductors could also be used. These semiconductor materials includes not only lattice-matched but also lattice-mismatched materials. Additionally, the present invention is not limited specifically to the above-mentioned wavelength range but could also be implemented in a 0.8 μm range now widely used in optical transmission and optical switching, 1.3 μm and 1.5 μm ranges and other arbitrary wavelength ranges as long as they allow optical absorption and amplification by the above-mentioned semiconductor materials.

As described above in detail, the absorptance recovery time of the original absorptance of the conventional saturable absorption element after it has once reached the absorption saturated state is limited by the carrier life time and is about hundreds of picoseconds. According to the present invention, the absorptance recovery time can be reduced down to a couple of pico-seconds significantly shorter than the carrier life time through utilization of the stimulated emission in the semiconductor laser element. Thus, the present invention permits substantially complete reduction of noise from or reshaping of picosecond optical pulses, and hence is of great utility in practical use.

What we claim is:

1. An optical short pulse reshaping device, comprising: a semiconductor laser element, means for injecting an electric current to said semiconductor laser element for obtaining an oscillation state of said semiconductor laser element, means for injecting into said semiconductor laser element input optical short pulses of a wavelength shorter than that of the oscillation light of said semiconductor laser element; and means for taking out optical short pulses emitted from said semiconductor laser element.

2. An optical short pulse reshaping device according to claim 1, in which said means for taking out said optical signal pulses emitted from said semiconductor laser element is means for taking out said optical signal pulses in distinction from said oscillation light.

3. An optical short pulse reshaping device according to claim 1, in which said means for taking out said optical signal pulses emitted from said semiconductor laser element has a band-pass filter which receives said optical signal pulses and said oscillation light emitted from said semiconductor laser element and passes therethrough only said optical signal pulses.

4. An optical short pulse reshaping device according to claim 1, in which in that said semiconductor laser element has a single wavelength of oscillation.

5. An optical short pulse reshaping device according to claim 1, in which said semiconductor laser element has a plurality of wavelengths of oscillation and said means for injecting into said semiconductor laser element input optical short pulses of a wavelength shorter than that of the oscillation light of said semiconductor laser element is means for injecting into said semiconductor laser element an optical signal pulses of a wavelength shorter than the shortest wavelength of said oscillation light of said semiconductor laser element.

6. An optical short pulse reshaping device according to claim 1, wherein:

said semiconductor laser element is a semiconductor laser element of surface emitting type;

said means for injecting into said semiconductor laser element input optical short pulses of a wavelength shorter than that of the oscillation light of said semiconductor laser element is means for injecting said input optical signal pulses into said semiconductor laser element at an angle to the direction of emission therefrom of said oscillation light; and means for taking out optical short pulses emitted from said semiconductor laser element is means for taking out said optical signal pulses alone through utilization of a difference between directions of emission of said optical signal pulses and said oscillation light from said semiconductor laser element.

7. An optical short pulse reshaping device according to claim 1, in which said semiconductor laser element comprises an active layer formed by multiple quantum wells.

8. An optical short pulse reshaping device according to claim 7, in which said multiple quantum wells forming said active layer of said semiconductor laser element have tensile strains so that said semiconductor laser element has the same gain for TE and TM polarized waves.

9. An optical short pulse reshaping device according to claim 1, in which said means for injecting into said semiconductor laser element input optical short pulses of a wavelength shorter than that of the oscillation light of said semiconductor laser element is means for injecting into said semiconductor laser element an optical signal pulses of a wavelength shorter by a value of 0.01 µm to 0.08 µm than that of said oscillation light of said semiconductor laser element.

10. An optical short pulse reshaping device, comprising: a semiconductor laser element, means for injecting an electric current to said semiconductor laser element for obtaining an oscillation state of said semiconductor laser element, means for injecting into said semiconductor laser element input optical short pulses of a wavelength shorter than that of the oscillation light of said semiconductor laser element; and means for taking out reshaped optical short pulses from said semiconductor laser element.

* * * * *